(12) United States Patent  (10) Patent No.: US 7,876,873 B2
Hsieh  (45) Date of Patent: Jan. 25, 2011

(54) ASYNCHRONOUS PING-PONG COUNTER AND THEREOF METHOD

(75) Inventor: Hong-Yean Hsieh, Santa Clara, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 50 days.

(21) Appl. No.: 12/477,083

(22) Filed: Jun. 2, 2009

(65) Prior Publication Data

US 2009/0304140 A1 Dec. 10, 2009

Related U.S. Application Data

(60) Provisional application No. 61/059,229, filed on Jun. 5, 2008.

(51) Int. Cl.
*H03K 21/38* (2006.01)
*H03K 23/00* (2006.01)

(52) U.S. Cl. ......................... 377/107; 377/118; 377/119

(58) Field of Classification Search .................. None
See application file for complete search history.

(56) References Cited

U.S. PATENT DOCUMENTS

| | | | | |
|---|---|---|---|---|
| 6,219,798 B1 * | 4/2001 | Choi | ........................... | 713/502 |
| 6,222,900 B1 * | 4/2001 | Hara | ........................... | 377/107 |
| 6,548,997 B1 * | 4/2003 | Bronfer et al. | ........... | 324/76.48 |
| 6,735,270 B1 * | 5/2004 | Yeung | ........................... | 377/34 |
| 2009/0307518 A1 * | 12/2009 | Hsieh | ........................... | 713/501 |

* cited by examiner

*Primary Examiner*—Tuan Lam
(74) *Attorney, Agent, or Firm*—IPR Works, LLC

(57) ABSTRACT

An asynchronous ping-pong counter is disclosed. The asynchronous ping-pong counter comprises a first asynchronous counter, a second synchronous counter, and a controller, the asynchronous ping-pong counter operates between a first state and a second state. In the first state, the first asynchronous counter counts a first number of clock edges of a fast clock signal, and the second asynchronous counter holds a first counter output value. In the second state, the second asynchronous counter counts a second number of clock edges of the fast clock signal, and the first asynchronous counter holds a second counter output value. The controller determines a state transition based on a sampling of a slow clock signal by the fast clock signal.

16 Claims, 4 Drawing Sheets

ASYNCHRONOUS PING-PONG COUNTER AND THEREOF METHOD

CROSS REFERENCE TO RELATED APPLICATIONS

This application claims the benefit of U.S. Provisional Application No. 61/059,229, filed on Jun. 5, 2008 and entitled "ASYNCHRONOUS PING-PONG COUNTER", the contents of which are incorporated herein by reference.

BACKGROUND OF THE INVENTION

1. Field of the Invention

The present invention relates generally to the design of a counter. In particular, it relates to the design of an asynchronous ping-pong counter.

2. Description of the Background Art

A counter is defined here as a building block that receives a fast clock and a slow clock, and generate an output value. A rising edge is defined as the transition of a digital signal from low to high. The output value represents the number of rising edges of the fast clock that exists between two neighboring rising edges of the slow clock. A synchronous counter clocked by the fast clock can be used to over-sample the slow clock to determine the number of rising edges by inspecting the sampled results. However, if the fast clock runs at a very high speed, e.g. 5 GHz, and the slow clock runs at an extremely slow speed, e.g. 10 MHz, it is almost impossible to meet both the setup and hold timing requirements of each flip-flop by using any synchronous counter in existing technologies. An asynchronous ping-pong counter is presented in this work to solve the aforementioned problems.

SUMMARY

In one embodiment, an asynchronous ping-pong counter comprises an edge detector, a dual asynchronous counter, and a finite state machine. The edge detector receives a first input clock and a second input clock, and generates a pulse signal to indicate the arrival of a rising edge of the second input clock. The rising edges of the first input clock are arranged into different time slots on the basis of the pulse signal generated by the edge detector. The dual asynchronous counter receives a binary select signal from the finite state machine and the first input clock, and generates a counter value that is the number of the rising edges in each time slot. The dual asynchronous counter includes a first asynchronous counter and a second asynchronous counter. When the first asynchronous counter is receiving the rising edges of the first input clock in the current time slot, the second asynchronous counter is calculating the number of the rising edges in the previous time slot and generating the counter value and vice versa. The choice of which asynchronous counter is selected depends on the binary value of the select signal. The finite state machine receives the pulse signal and the first input clock, and generate the select signal to indicate that the rising edges of the first input clock is coupled to either the first asynchronous counter or the second asynchronous counter. The select signal also indicates which asynchronous counter outputs the counter value in the previous time slot.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1A:
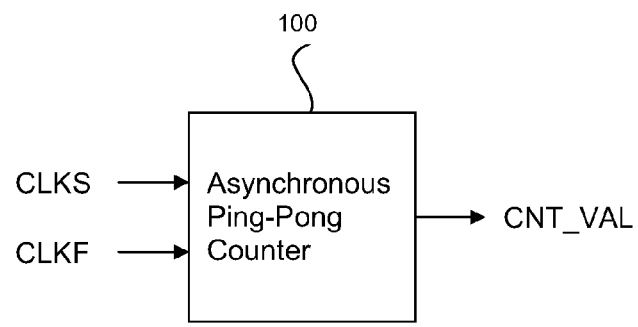
FIG. 1(a) shows a block diagram of an asynchronous ping-pong counter.
Figure 1B:
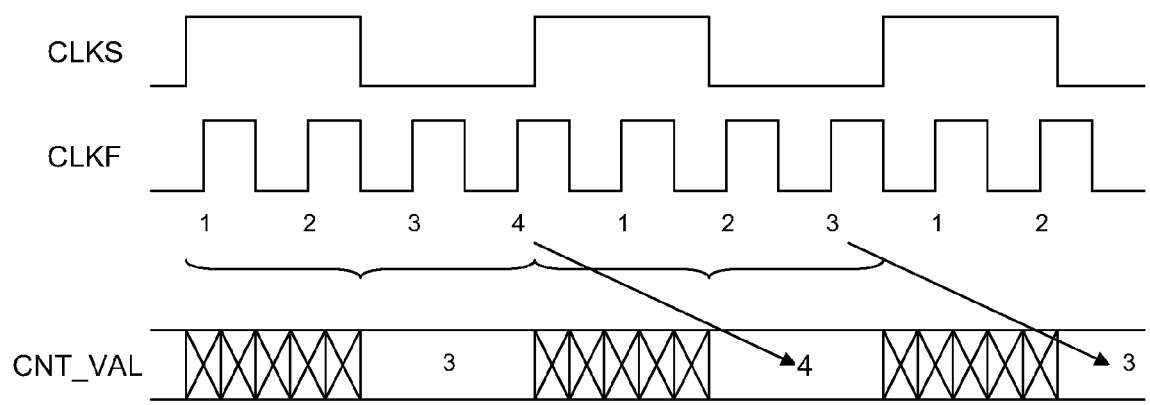
FIG. 1(b) shows a timing diagram of the asynchronous ping-pong counter of FIG. 1(a).

FIG. 1(a) shows a proposed asynchronous ping-ping counter in accordance with an embodiment of the present invention. In the example of FIG. 1(a), the asynchronous ping-pong counter receives a first input clock (CLKF in FIG. 1(a)), a second input clock (CLKS in FIG. 1(a)), and generates a digital output (CNT_VAL in FIG. 1(a)) that is the number of rising edges of the first input clock between two neighboring rising edges of the second input clock. Typical input and output waveforms are shown in the timing diagram of FIG. 1(b), where the asynchronous ping-pong counter 100 calculates the number of the rising edges of the first input clock between two neighboring rising edges of the second input clock to generate the digital output CNT_VAL. The digital output CNT_VAL is a multi-bit digital value, with its bit width dependent on the maximally possible number of rising edges between two neighboring rising edges of the second input clock.

Figure 2:
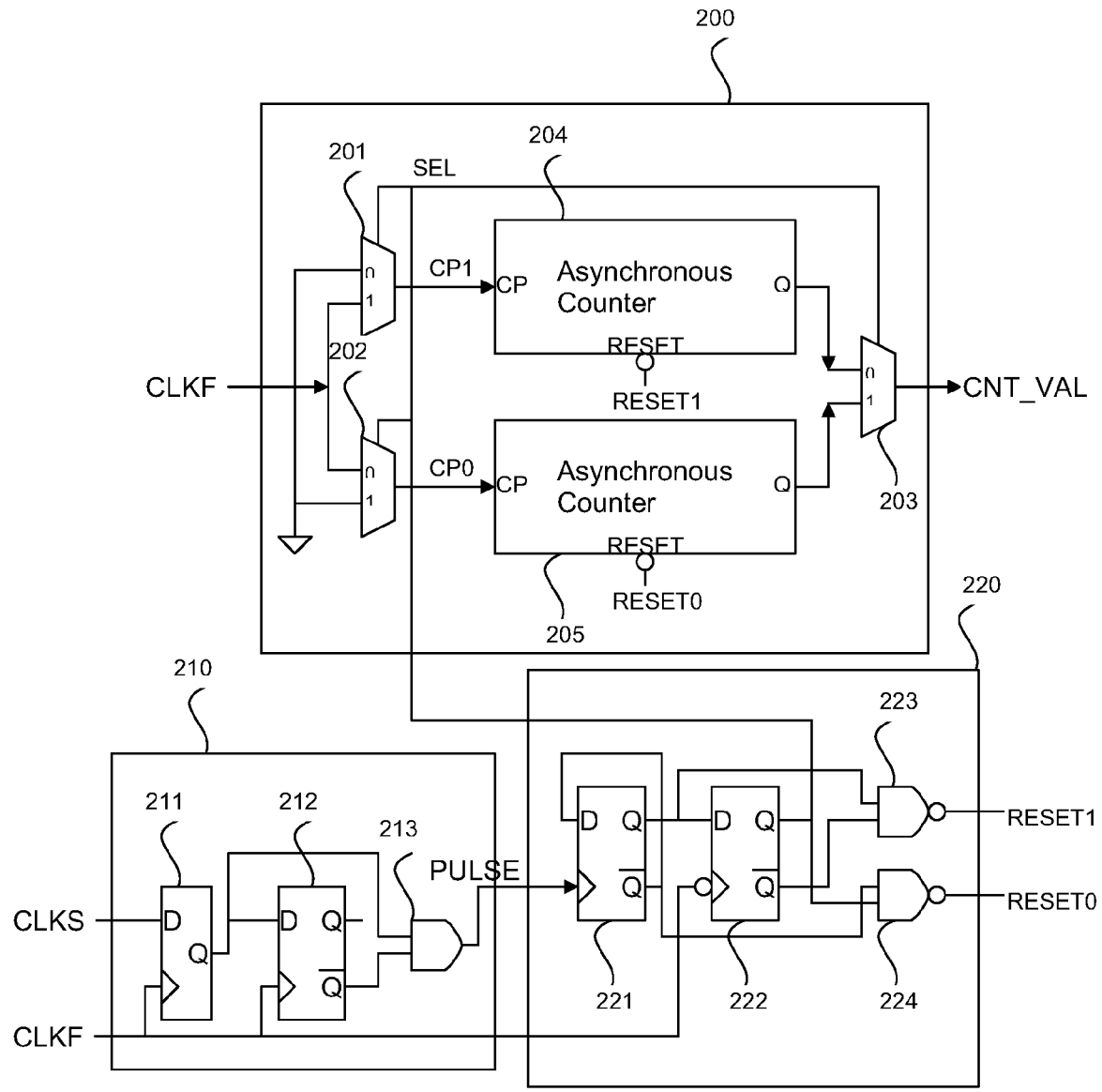
FIG. 2 schematically shows an asynchronous ping-pong counter in accordance with an embodiment of the present invention.

In one embodiment, an asynchronous ping-pong counter is configured for receiving a first input clock CLKF and a second input clock CLKS, and for generating a digital output CNT_VAL that represents the number of the rising edges of the first clock signal between two neighboring rising edges of the second clock signal. FIG. 2 schematically shows an asynchronous ping-pong counter in accordance with an embodiment of the present invention. In the example of FIG. 2, the asynchronous ping-pong counter comprises a dual asynchronous counter 200, an edge detector 210, and a finite state machine 220.

An edge detector 210 is first employed to detect a rising transition edge of the second clock and generates a corresponding pulse signal. In one embodiment, the edge detector is configured to receive the first input clock and the second input clock, and generate the pulse signal. In the example of FIG. 2, the edge detector 210 comprises a first flip-flop 211, a second flip-flop 212, and an AND gate 213. The edge detector 210 applies the first clock signal to the clock pin of the first flip-flop 211 to sample the second clock signal. The output of the first flip-flop is connected to the data input pin D of the second flip-flop 212 that is also clocked by the first clock signal. The output of the first flip-flop and the negated output of the second flip-flop are ANDed together by the AND gate 213 to detect a rising transition edge of the second clock signal. Once a rising edge is detected, a corresponding pulse signal PULSE is generated. The time period between the rising edges of two neighboring pulses is called a time slot.

The asynchronous ping-pong counter comprises a dual asynchronous counter 200 to calculate the number of the rising edges of the first input clock in each time slot. In the example of FIG. 2, the dual asynchronous counter 200 comprises a first multiplexer 201, a second multiplexer 202, a third multiplexer 203, a first asynchronous counter 204, and a second asynchronous counter 205. The dual asynchronous counter 200 operates in a ping-pong mode. When one asynchronous counter is used to receive the rising edges of the first input clock in the current time slot, the other asynchronous counter is used to calculate the number of the rising edges of the first input clock in the previous time slot and generate the digital output signal and vice versa.

Figure 4:
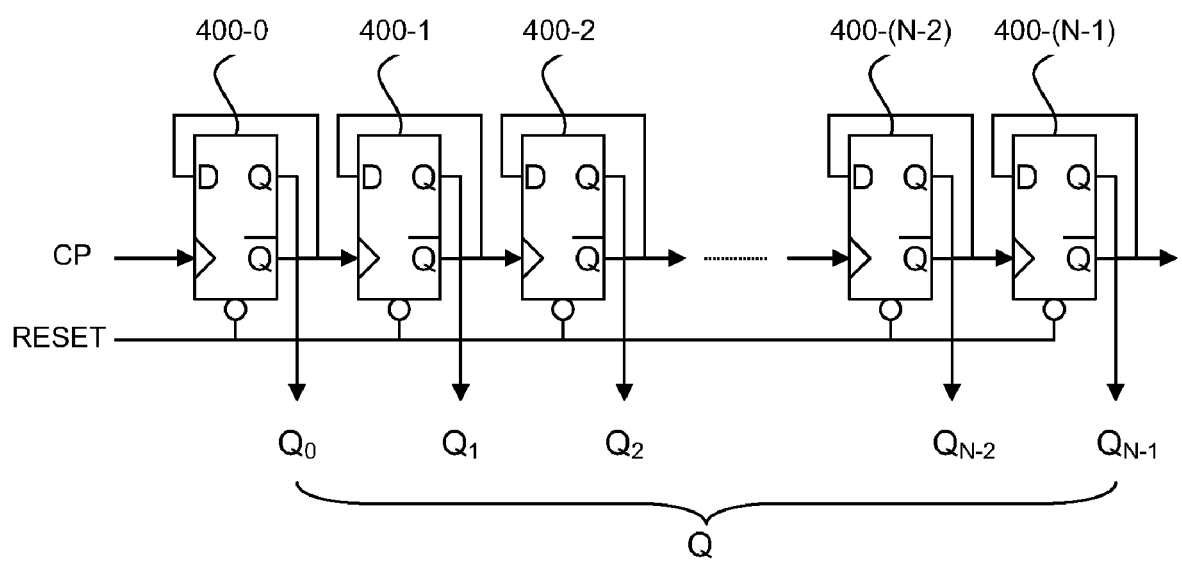
FIG. 4 schematically shows an asynchronous counter in accordance with an embodiment of the present invention.

The first and second asynchronous counters can be any asynchronous counter. In one embodiment, the asynchronous counter is configured to receive a series of pulses from an input signal CP, a reset signal RESET, and generate a digital output Q that represents the number of the rising edges of the input signal CP. FIG. 4 schematically shows an asynchronous counter in accordance with an embodiment of the present invention. This embodiment is a ripple counter. The ripple counter comprises a series of connected flip-flops. The total number (i.e. N) of the required flip-flops depends on the maximally possible number of rising edges of the input signal CP. Each flip-flop has a clock input pin, a data input pin, an output pin, a negated output pin, and a reset pin. A rising edge at the clock input pin of a flip-flop samples a binary value at the data input pin into the output pin and its negative value into the negated output pin. A binary zero at the reset pin will reset the flip-flop such that the values at its output pin and negative output pin become a binary zero and a binary one, respectively. The clock input pin of the first flip-flop is driven by the input signal CP. The clock input pins of the other flip-flops are driven by the negated outputs of the proceeding flip-flops. Due to the nature of the asynchronous counter, the rising edges of the input signal CP are rippled through the counter. After the ripple stops, the data at the output pins of all the flip-flops represents the number of the rising edges of the input signal CP. When the reset signal RESET changes to a binary zero, all the flip-flops will be reset.

The choice of the asynchronous counter depends on the binary value of a signal SEL that is generated by the finite state machine 220. When the signal SEL is a binary one, the first multiplexer 201 couples the first input clock CLKF to the input signal CP of the first asynchronous counter 204 whereas the input signal CP of the second asynchronous counter 205 is tied to a binary zero through the second multiplexer 202. In the same time slot, the output signal Q of the second asynchronous counter 205 is coupled to the output signal CNT_VAL through the third multiplexer 203. This configuration is for the first asynchronous counter to receive the input signal from the first input clock CLKF in the current time slot and for the second asynchronous counter to stop receiving the first clock and to generate the number of the rising edges of the first input clock in the previous time slot.

When the signal SEL is a binary zero, the second multiplexer 202 couples the first input clock CLKF to the input signal CP of the second asynchronous counter 205 whereas the input signal CP of the first asynchronous counter 204 is tied to a binary zero through the first multiplexer 201. In the same time slot, the output signal Q of the first asynchronous counter 204 is coupled to the output signal CNT_VAL through the third multiplexer 203. This configuration is for the second asynchronous counter to receive the input signal from the first input clock CLKF in the current time slot and for the first asynchronous counter to stop receiving the first input clock and to generate the number of the rising edges of the first input clock in the previous time slot.

The pulse signal PULSE generated by the edge detector 210 is connected to a finite state machine. The finite state machine 220 comprises a third flip-flop 221, a fourth flip-flop 222, a NAND gate 223, and another NAND gate 224. The pulse signal PULSE continuously toggles the third flip-flop 221 in the finite state machine 220. The output of the third flip-flop 221 is connected to the data input of the fourth flip-flop 222 that is clocked by the falling edge of the first input clock CLKF. The binary data at the output pin of the fourth flip-flop 222 is the signal SEL. Because the fourth flip-flop 222 is clocked by the falling edge of the first input clock CLKF, the signal SEL always changes its value when the first input clock CLKF is a binary zero. In doing so, no glitches will be generated at the signal nets CP1 and CP0 inside the dual asynchronous counter 200 when the signal SEL switches its value from a binary one to a binary zero or from a binary zero to a binary one.

Before the signal SEL switches to a binary one, the NAND gate 223 is used to generate a binary zero to clear the old content of the first asynchronous counter 204. When the value of the signal SEL becomes a binary one, the first input clock is coupled to the input of the first asynchronous counter 204 through the first multiplexer 201 and the first asynchronous counter 204 receives the rising edges of the first clock signal in the current time slot. Meanwhile, the second asynchronous counter 205 stop receiving any more rising edges of the first clock signal by tying its input to a binary zero through the second multiplexer 202 and its output is coupled to the output value CNT_VAL through the third multiplexer 203.

Figure 3:
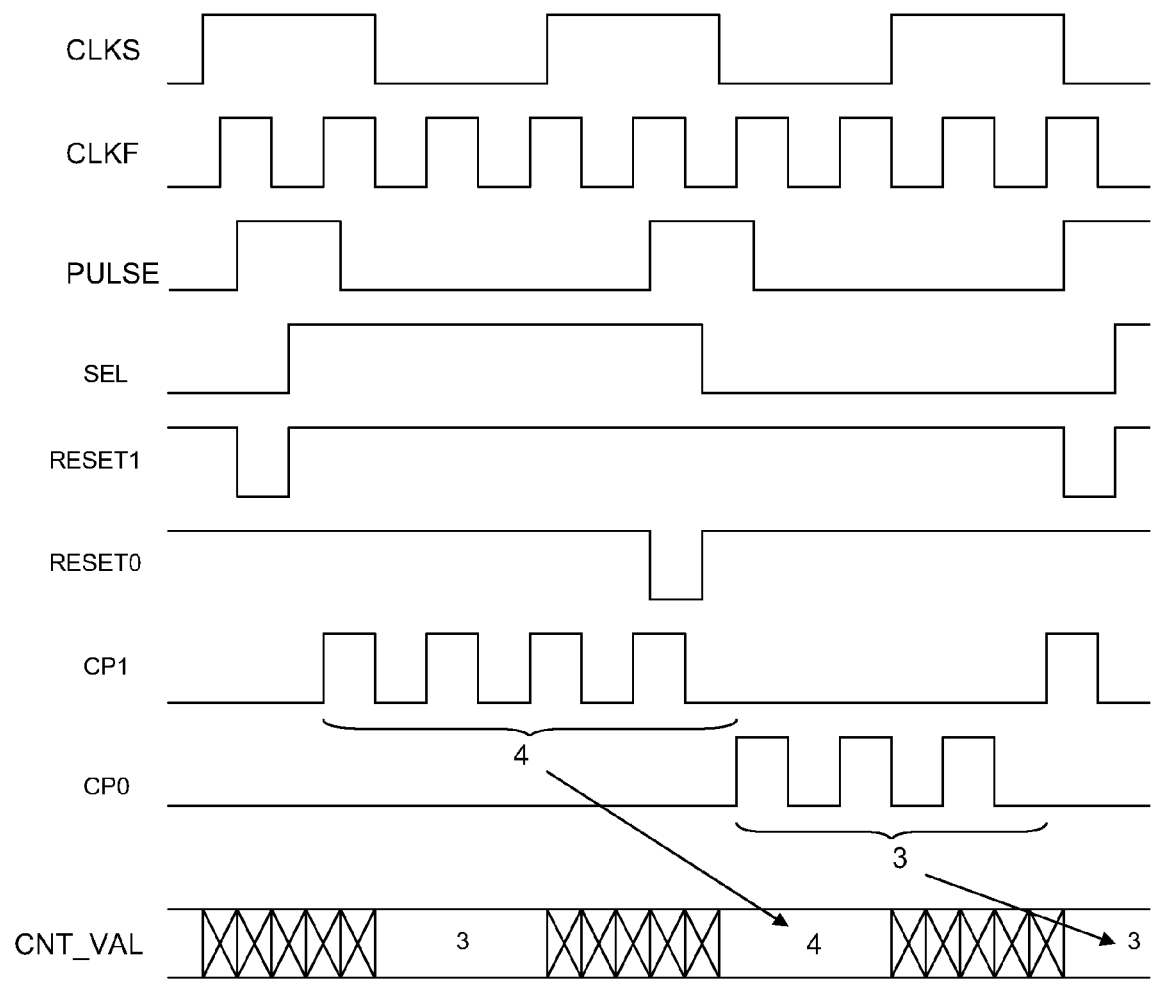
FIG. 3 shows a timing diagram of the asynchronous ping-pong counter of FIG. 2.

Before the signal SEL switches to a binary zero, the NAND gate 224 generates a binary zero to clear the old content of the second asynchronous counter 205. When the value of the signal SEL becomes a binary zero, the first input clock is coupled to the input of the second asynchronous counter 205 through the second multiplexer 202 and the second asynchronous counter 205 receives the rising edges of the first clock signal in the current time slot. Meanwhile, the first asynchronous counter 204 stop receiving any more rising edges of the first clock signal by tying its input to a binary zero through the first multiplexer 201 and its output is coupled to the output signal CNT_VAL through the third multiplexer 203. The input, internal node, and output waveforms are shown in the timing diagram of FIG. 3.

An asynchronous ping-pong counter has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus comprising a first asynchronous counter, a second synchronous counter, and a controller, the apparatus toggling between a first state and a second state, wherein:
   in the first state, the first asynchronous counter counts a first number of clock edges of a fast clock signal, and the second asynchronous counter holds a first counter output value;

in the second state, the second asynchronous counter counts a second number of clock edges of the fast clock signal, and the first asynchronous counter holds a second counter output value; and the controller determines a state transition based on a sampling of a slow clock signal by the fast clock signal.

2. The apparatus of claim 1, wherein: in the first state the first counter output value is selected as an output of the apparatus, and in the second state the second output value is selected as the output of the apparatus.

3. The apparatus of claim 1, wherein the controller issues a first reset signal to reset the first asynchronous counter upon a transition to the first state, and issues a second reset signal to reset the second asynchronous counter upon a transition to the second state.

4. The apparatus of claim 3, wherein the controller determines the state transition based on detecting a clock edge of the slow clock signal using the sampling by the fast clock signal.

5. The apparatus of claim 1, further comprising an input multiplexer for multiplexing the fast clock signal into an input of the first asynchronous counter during the first state, and multiplexing the fast clock signal into an input of the second asynchronous counter during the second state.

6. The apparatus of claim 5, further comprising an output multiplexer for multiplexing the first counter output value into the output of the apparatus during the first state, and multiplexing the second counter output value into the output of the apparatus during the second state.

7. The apparatus of claim 1, further comprising an output multiplexer for multiplexing the first counter output value into the output of the apparatus during the first state, and multiplexing the second counter output value into the output of the apparatus during the second state.

8. The apparatus of claim 1, wherein the first asynchronous counter comprises a ripple counter.

9. An apparatus comprising a first asynchronous counter, a second asynchronous counter, an input selector, an output selector, and a controller controlling a toggling between a first state and a second state, wherein:

during the first state, the input selector selects a first clock signal as an input to the first asynchronous counter and a null signal as an input to the second asynchronous counter, and the output selector selects an output of the second asynchronous counter as an output of the apparatus; and during the second state, the input selector selects the first clock signal as the input to the second asynchronous counter and a null signal as the input to the first asynchronous counter, and the output selector selects an output of the first asynchronous counter as the output of the apparatus.

10. The apparatus of claim 9, wherein the controller determines to make a state transition based on sampling a second clock signal using the first clock signal, wherein a frequency of the first clock signal is higher than a frequency of the second clock signal.

11. The apparatus of claim 9, wherein the controller issues a first reset signal to reset the first asynchronous counter upon a transition to the first state, and issues a second reset signal to reset the second asynchronous counter upon transition to the second state.

12. The apparatus of claim 9, wherein the controller determines to make the state transition based on detecting a clock edge of the second clock signal.

13. A method comprising:

alternately selecting between a first asynchronous counter and a second asynchronous counter for counting a number of clock edges of a fast clock;

selecting an output from the second asynchronous counter when the first asynchronous counter is selected for the counting;

selecting an output from the first asynchronous counter when the second asynchronous counter is selected for the counting; and alternating the selecting upon detecting a clock edge of a slow clock.

14. The method of claim 13 further comprising: resetting the first asynchronous counter upon selecting the first asynchronous counter for the counting, and resetting the second asynchronous counter upon selecting the second asynchronous counter for the counting.

15. The method of claim 13 further comprising: freezing the second asynchronous counter when the first asynchronous counter is selected for the counting, and freezing the first asynchronous counter when the second asynchronous counter is selected for the counting.

16. The method of claim 13, wherein the first asynchronous counter comprises a ripple counter.

* * * * *